(12) United States Patent
Gui et al.

(10) Patent No.: US 7,567,340 B2
(45) Date of Patent: Jul. 28, 2009

(54) LITHOGRAPHIC APPARATUS AND DEVICE MANUFACTURING METHOD

(75) Inventors: Cheng-Qun Gui, Best (NL); Keith Frank Best, Best (NL); Enno Van Den Brink, Eindhoven (NL); Budiman Sutedja, Venlo (NL); Peter Ten Berge, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 379 days.

(21) Appl. No.: 11/529,732

(22) Filed: Sep. 29, 2006

(65) Prior Publication Data

US 2008/0085462 A1    Apr. 10, 2008

(51) Int. Cl.
*G03B 27/58* (2006.01)
*G03B 27/52* (2006.01)

(52) U.S. Cl. ............................ 355/72; 355/55
(58) Field of Classification Search .................... 355/53, 355/72–76, 52, 55; 378/34, 35; 356/399–401
See application file for complete search history.

(56) References Cited

U.S. PATENT DOCUMENTS

| | | | |
|---|---|---|---|
| 2005/0186483 A1* | 8/2005 | Schoonewelle et al. | 430/4 |
| 2007/0181827 A1* | 8/2007 | Tempelaars et al. | 250/492.1 |
| 2007/0262268 A1* | 11/2007 | De Nivelle et al. | 250/492.1 |

* cited by examiner

*Primary Examiner*—Hung Henry Nguyen
(74) *Attorney, Agent, or Firm*—Pillsbury Winthrop Shaw Pittman LLP

(57) ABSTRACT

A device manufacturing method is disclosed that includes providing a substrate on a substrate table, the substrate having a target region comprising a plurality of generally planar surfaces, each surface having a different height relative to the substrate table, determining the relative heights of each generally planar surface, projecting a patterned beam of radiation onto the target region of the substrate such that the focal plane of the beam substantially coincides with the plane of one of the generally planar surfaces, moving the substrate table in a direction substantially parallel to the axis of the beam, and projecting the patterned beam of radiation onto the target region of the substrate such that the focal plane of the beam substantially coincides with the plane of another of the generally planar surfaces.

21 Claims, 6 Drawing Sheets

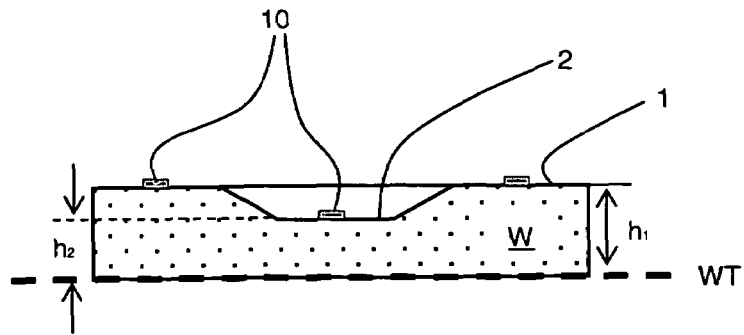
FIG 2A
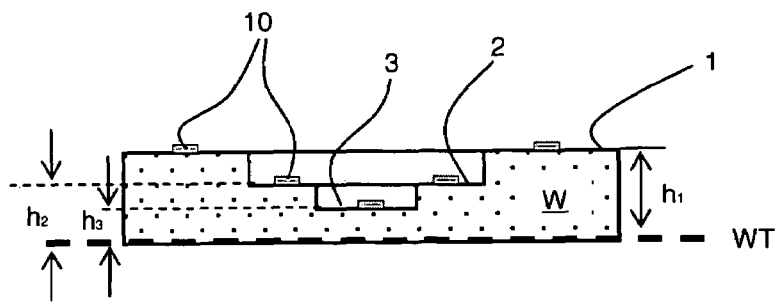
FIG 2B
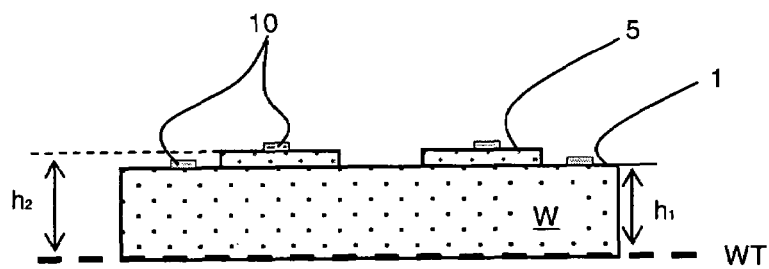
FIG 2C
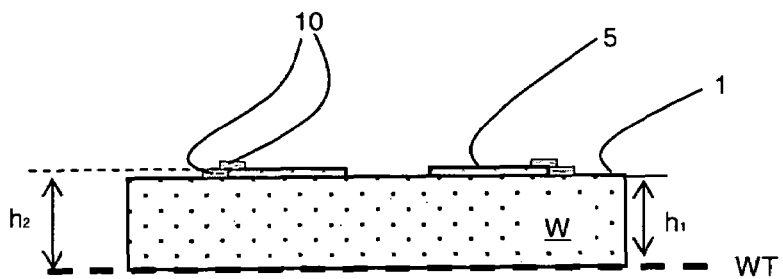
FIG 2D
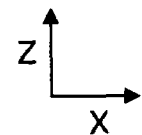

LITHOGRAPHIC APPARATUS AND DEVICE MANUFACTURING METHOD

FIELD

The present invention relates to a lithographic apparatus and a device manufacturing method.

BACKGROUND

A lithographic apparatus is a machine that applies a desired pattern onto a target region of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target region (e.g. comprising part of, one or several dies) on a substrate (e.g. a silicon wafer) that has a layer of radiation-sensitive material (resist). In general, a single substrate will contain a network of adjacent target regions that are successively exposed. Known lithographic apparatus include so-called steppers, in which each target region is irradiated by exposing an entire pattern onto the target region in one go, and so-called scanners, in which each target region is irradiated by scanning the pattern through the beam in a given direction (the "scanning"-direction) while synchronously scanning the substrate parallel or anti-parallel to this direction.

In some applications it may be desirable to pattern a substrate in which the upper layer of radiation sensitive material has a number of surfaces at different heights. This may, for example, occur when fabricating three-dimensional integrated circuits, micro electromechanical system (MEMS) devices (for example bio-MEMS devices), micro-fluidic structures or system-in-packaging (SiP) devices. When processing such multi-level substrates the critical dimension of the patterns being exposed may be important.

When a pattern is required to have a small critical dimension, for example less than one micrometer (1 μm), the depth of focus of the projected image may also be small. As such, any features being patterned on surfaces of a substrate that are at different heights, for example in a recess or on a raised portion, may be outside of the focal depth of the projection system when the substrate is normally aligned for exposure (i.e. when the main surface of the substrate lies substantially in line with the focal plane of the projection system). For example a relatively deep recess and or a relatively high raised portion could be fabricated on the surface of a substrate at a height of 100 μm or more above or below the normal surface of the substrate. In contrast, the focal depth of a typical projection system may be in the region of as little as plus or minus 1 μm. Thus, the surface of the recess/raised portion will lie outside of the focus of the projected beam, thereby limiting the accuracy with which an image may be patterned. The term 'main surface of the substrate' is intended to mean the surface of the substrate in the absence of a recess or raised portion. This is not intended to be limited to a single surface, and may be a plurality of surfaces which are separated from one another.

SUMMARY

A possible solution to this problem may be to expose the substrate at a first height, wherein the focal plane is generally aligned with the main surface of the substrate, and then moving the substrate relative to the projection system by a distance equal to the intended height of the recess/raised portion feature, to expose features on the surface of the recess/raised portion with the focal plane of the projection system closer to the surface of the recess/raised portion. However, due to the narrow depth of focus of the projection system, it may not be possible to rely on the intended size of a substrate surface feature in order to adjust with sufficient accuracy the position of the surface relative to the projection system, and ensure that the projected image is in focus on the surface. This may be particularly true when imaging features with a small critical dimension. More specifically, the accuracy with which the features are fabricated may be of a greater magnitude than the depth of focus of the projection system. For example, an etched recess with an intended depth of 100 μm may in fact be formed with an accuracy of plus or minus 10 μm. Therefore, the possible height variation of the recess may be significantly greater than the depth of focus, which may for example be only plus or minus 1 μm when patterning sub-micrometer features. It may not be possible to overcome this problem by improving the accuracy of the fabrication process (e.g. the etching process) that is used to form the multi-level features on a substrate, since the accuracy may be limited as a result of process variation from one substrate to another.

According to an aspect of the invention, there is provided a device manufacturing method comprising:

providing a substrate on a substrate table, the substrate having a target region comprising a plurality of generally planar surfaces, each surface having a different height relative to the substrate table;

determining the relative heights of each generally planar surface;

projecting a patterned beam of radiation onto the target region of the substrate such that the focal plane of the beam substantially coincides with the plane of one of the generally planar surfaces;

moving the substrate table in a direction substantially parallel to the axis of the beam; and projecting the patterned beam of radiation onto the target region of the substrate such that the focal plane of the beam substantially coincides with the plane of another of the generally planar surfaces.

According to a further aspect of the invention, there is provided a lithographic apparatus, comprising:

a support structure configured to hold a patterning device, the patterning device configured to impart the beam with a pattern in its cross-section;

a substrate table configured to hold a substrate, the substrate having a target region comprising a plurality of generally planar surfaces, each surface being arranged at a different height relative to the substrate table;

a projection system configured to project a patterned beam onto a target region of the substrate; and a leveling system arranged to determining the relative heights of each generally planar surface and adjust the substrate table in a direction substantially parallel to the axis of the beam such that the focal plane of the beam substantially coincides with each plane during projection.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2a-2d schematically illustrate examples of substrates on which features are deposited on surfaces at different heights;

DETAILED DESCRIPTION

Figure 1:
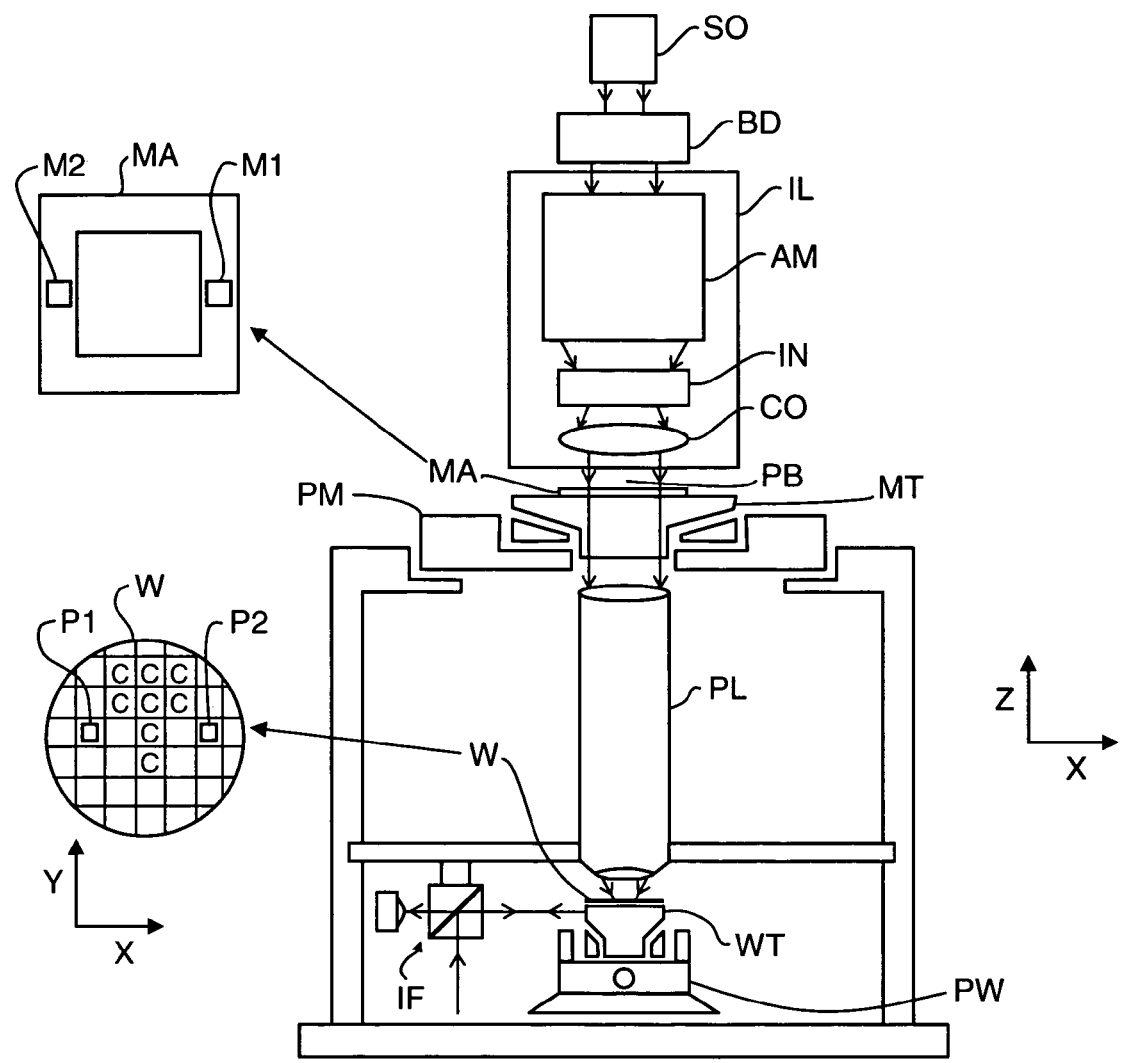
FIG. 1 depicts a lithographic apparatus according to an embodiment of the invention.

FIG. 1 schematically depicts a lithographic apparatus according to a particular embodiment of the invention. The apparatus comprises:

- an illumination system (illuminator) IL configured to condition a beam PB of radiation (e.g. UV radiation or EUV radiation);
- a support structure (e.g. a mask table) MT configured to support a patterning device (e.g. a mask) MA and connected to a first positioner PM arranged to accurately position the patterning device with respect to item PL;
- a substrate table (e.g. a wafer table) WT configured to hold a substrate (e.g. a resist-coated wafer) W and connected to a second positioner PW arranged to accurately position the substrate with respect to item PL; and
- a projection system (e.g. a refractive projection lens) PL configured to image a pattern imparted to the beam PB by the patterning device MA onto a target region C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjuster AM to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section.

The beam PB is incident on the patterning device MA, which is held on the support structure MT. Having traversed the patterning device MA, the beam PB passes through the projection system PL, which focuses the beam onto a target region C of the substrate W. With the aid of the second positioner PW and position sensor IF (e.g. an interferometric device), the substrate table WT can be moved accurately, e.g. so as to position different target regions C in the path of the beam PB. Similarly, the first positioner PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in one or more of the following modes:

1. In step mode, the support structure MT and the substrate table WT are kept essentially stationary, while an entire pattern imparted to the beam PB is projected onto a target region C at one time (i.e. a single static exposure). The substrate table WT is then shifted in the X and/or Y direction so that a different target region C can be exposed. In step mode, the maximum size of the exposure field limits the size of the target region C imaged in a single static exposure.

2. In scan mode, the support structure MT and the substrate table WT are scanned synchronously while a pattern imparted to the beam PB is projected onto a target region C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target region in a single dynamic exposure, whereas the length of the scanning motion determines the height (in the scanning direction) of the target region.

3. In another mode, the support structure MT is kept essentially stationary holding a programmable patterning device, and the substrate table WT is moved or scanned while a pattern imparted to the beam PB is projected onto a target region C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As discussed above, it may be desirable to pattern a substrate that is provided with surfaces at a variety of levels. FIG. 2a schematically shows a target region of a substrate W having a first surface 1 (which may, for example, be the unmodified surface of the substrate W) provided at a first height $h_1$ above the substrate table WT and a second surface 2 at a different height $h_2$. The height $h_1$, $h_2$ is expressed, as shown, in a direction perpendicular to the surface of the substrate table WT. Thus, since the surface of the substrate table WT is generally perpendicular to the axis of the projection system PL, the height may be expressed in the direction of the Z-axis of the lithographic apparatus. As shown in FIG. 2a, the second surface 2 may, for example, be at a lower height than the first surface 1, thereby forming a recess. For example, the two surfaces may be separated by a height greater than or equal to 3 μm (for example, the separation of the surfaces may be up to 100 μm or more). In the example of FIG. 2a, features 10 are to be formed, by lithographic processing, on the substrate at several locations (on both of the surfaces 1, 2 that are each at different heights).

The number of surfaces provided at different levels on the substrate W may be greater than 2. For example, the substrate W may include a third surface 3, as shown in FIG. 2b, at a third height $h_3$ above the substrate table WT, thereby forming a recess with two different depths. A typical multi-level substrate may, for example, be provided with 2 to 4 different surfaces at different heights. The maximum number of levels that may be provided will depend on the height separation of each individual level and the maximum possible total height difference. For example, each individual surface may be spaced apart by a distance of approximately 3 to 5 μm and the maximum possible total depth may, for example, be 100 μm (thus, the substrate could have a maximum of between 20 to 30 surface levels).

It will be appreciated that the different surfaces may, additionally or alternatively, comprise raised portions fabricated on the main surface 1 of the substrate, as shown in FIGS. 2c and 2d. Accordingly, any references herein to the depth or height of a surface are not intended to be limiting unless otherwise indicated and may refer to variations in height of a surface with respect to an unmodified portion of the substrate in either direction (i.e. a positive or negative height/depth in a direction substantially perpendicular to the surface of the substrate table). Raised features may, for example, be provided for 3D integrated circuits, System-in-Packaging (SiP) devices or in technologies that process bonded die-on-wafer structures. Accordingly, FIG. 2c illustrates an arrangement in which a substrate W comprises a first surface 1 and a second, raised, surface 2, each surface having at least one feature 10 to be formed during the lithographic process. The raised feature fabricated on the substrate W may be a die 5 attached to a substrate and in some arrangements, as shown in FIG. 2d, the features 10 could be used to form a connection between the die 5 and the substrate W.

As discussed above, the variation in height between the main surface 1 of substrate W and a second surface 2 (i.e. $h_1$-$h_2$), on which one or more features 10 are being patterned, may be greater than the depth of focus of the projection system. For example, the depth of focus may be 1 μm, whereas the height difference between surfaces to be patterned may be between 3 and 100 μm (or more). This may, therefore have a limiting effect on the possible critical dimension of the features 10 which may be patterned.

Figure 3:
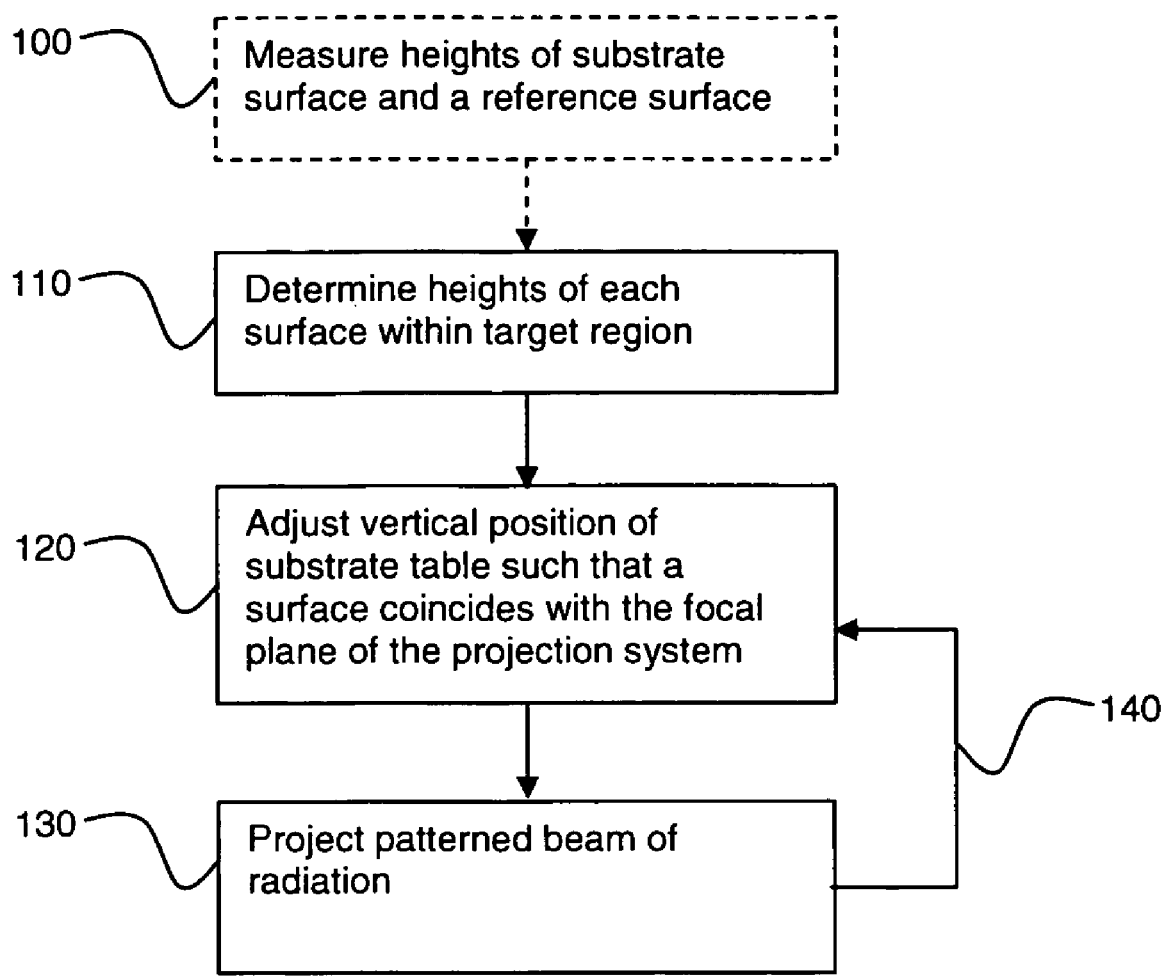
FIG. 3 depicts the method of lithography according to an embodiment of the invention in the form of a flow chart.

With reference to FIG. 3, in an embodiment of the invention, an improved lithography method comprises the step 10 of determining the heights of the surfaces within the target region on the substrate W and the step 120 of positioning the substrate W such that one of the surfaces generally coincides with the focal plane of the projection system PL before the step 130 of projecting a patterned beam of radiation onto the substrate W. The steps 120 and 130 are then repeated for each surface level 140. In other words, the position of the substrate W is then adjusted in the direction substantially parallel to the axis of the projection system PL (i.e. the Z axis of the lithographic apparatus), such that the plane of another one of the surfaces on the substrate W generally coincides with the focal plane of the projection system, and the patterned beam of radiation is projected onto the target region. Projection of the patterned beam of radiation is interrupted to allow the step 120 of adjusting the position of the substrate W to take place.

In an embodiment, the step 110 of determining the heights of the different surfaces within a target region of the substrate could be carried out away from the exposure position of the substrate. For example, the lithographic apparatus may be of the type having two substrate tables WT such that one substrate may be measured while a second is simultaneously being exposed. Alternatively, it may be that the heights of the surfaces are determined at the same time as exposing the substrate W.

As shown in dashed lines in FIG. 3, as will be explained in further detail below, the step 110 of determining the height of the surfaces within the target region of the substrate may also include a measuring step 100. The measuring step 100 may, for example, comprise measuring the height of an unmodified portion of the substrate and the height of a raised or lowered surface.

Figure 4A:
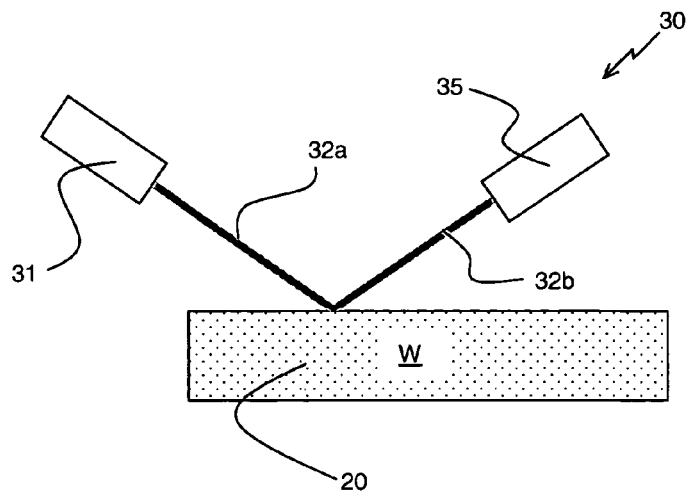
FIGS. 4a-4e schematically illustrate the measurement of a surface of a substrate.

The lithographic apparatus may typically comprise at least one level sensor, for example an optical level sensor. The level sensor may, for example, use a beam of radiation from a laser (for example, a GaAs laser). As will be appreciated by those skilled in the art, the level sensor may use any suitable narrowband source, or may use any suitable broadband source. As shown in FIG. 4a, the sensor 30 may comprise a source 31, which emits a beam 32a to be reflected by the surface of the substrate W, and a detector 35, which receives the beam and measures the position of the beam 32b. The position of the beam is indicative of the height of the surface of the substrate W at the point of incidence of the beam 32.

The apparatus may comprise more than one sensor 30, for example it may comprise a first sensor (which may, for example, be a broadband sensor) arranged to detect a beam at a first angle of incidence and a second sensor (which may, for example, be a narrowband sensor) arranged to detect a beam at a second angle of incidence. The sensors may be arranged to capture different ranges of variation in the height of the substrate W. For example, the broadband sensor may be arranged to measure variations of +/−30 μm and the narrowband sensor may be arranged to measure variations of +/−400 μm.

Figure 4B:
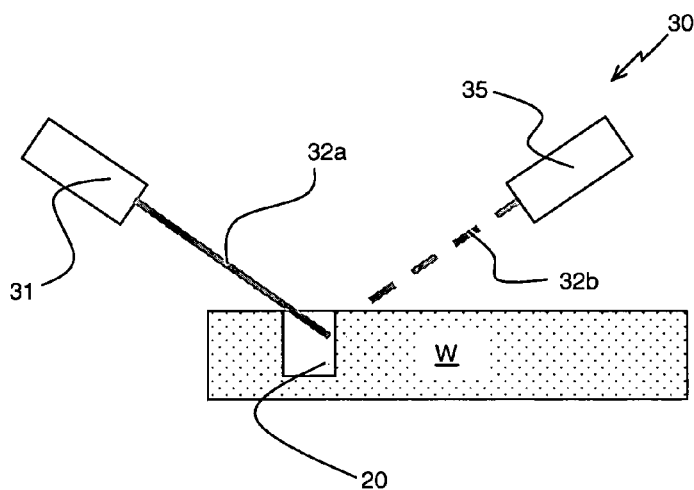

However, as shown in FIG. 4b, if a feature, for example a trench 20, is relatively deep and/or narrow, the beam 32 of the level sensor 30 is unable to measure the depth of the feature. This is because the angle of incidence of the beam is too shallow to reach the lower surface of the trench 20. The trench 20 is an example of a functional feature (i.e. a feature that will eventually form part of a circuit or device), and will hereafter be referred to as the functional feature 20.

Figure 4C:
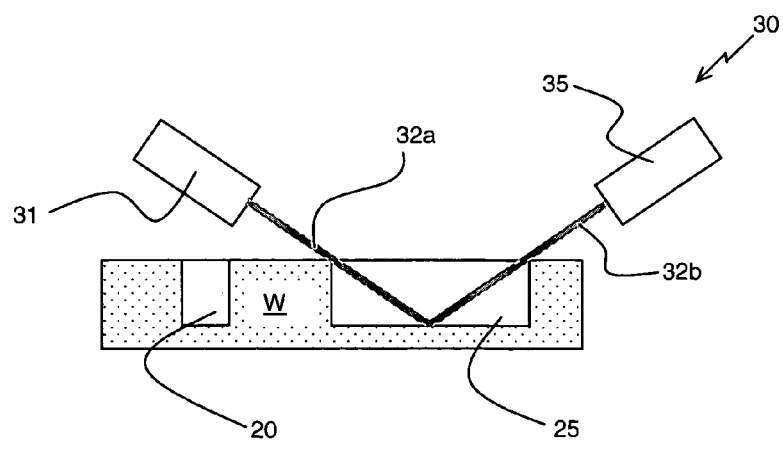

In an embodiment of the invention (as shown in FIG. 4c) the substrate W is provided with an additional feature 25 for measurement using the level sensor 30. This feature, which will not form part of the eventual circuit or device, is referred to as the reference feature 25. The reference feature 25 has dimensions which allow measurement of its depth using the level sensor 30. As will be explained in further detail below, the reference feature 25 may have a depth equal to that of the functional feature 20 (as shown in FIG. 4c) or the reference feature 25' may have a different depth to that of the functional feature 20 (as shown in FIG. 4e).

In FIG. 4c, a reference feature 25 is provided on the substrate having a depth substantially identical to that of the functional feature 20. For a known angle of incidence of the level sensor beam 32, the required length of reference feature 25 to allow depth measurement can be calculated using the approximate depth of the functional feature 20. For example, if the depth of the functional feature 20 is 100 μm and the angle of incidence of the beam 32 is 6 degrees (and it is assumed that the angle of reflection is also approximately 6 degrees) the distance from the center to the edge of the reference feature (to enable the beam to enter and reflect from the lower surface) is 100 μm/tan 6°. The reference feature 25 must therefore be at least twice this length (which in this case is equal to 1903 μm or approximately 2 mm). Therefore the reference feature may, for example, be approximately a 4 mm² square to enable a maximum depth measurement of 100 µm. In general the diameter of the level sensor beam 32 will be sufficiently small that its effect on the above calculation is negligible. However, if the diameter of the level sensor beam 32 is significant relative to the size of the reference feature, then the length of the reference feature should be increased by a sufficient amount to ensure that the level sensor beam may enter and leave the reference feature without part of it being blocked.

In order to reduce the needed size of the reference feature 25, the reference feature may be provided as a rectangle rather than a square. The rectangle should be longer in the direction of the level sensor beam 32 than in the direction transverse to the level sensor beam.

Figure 4D:
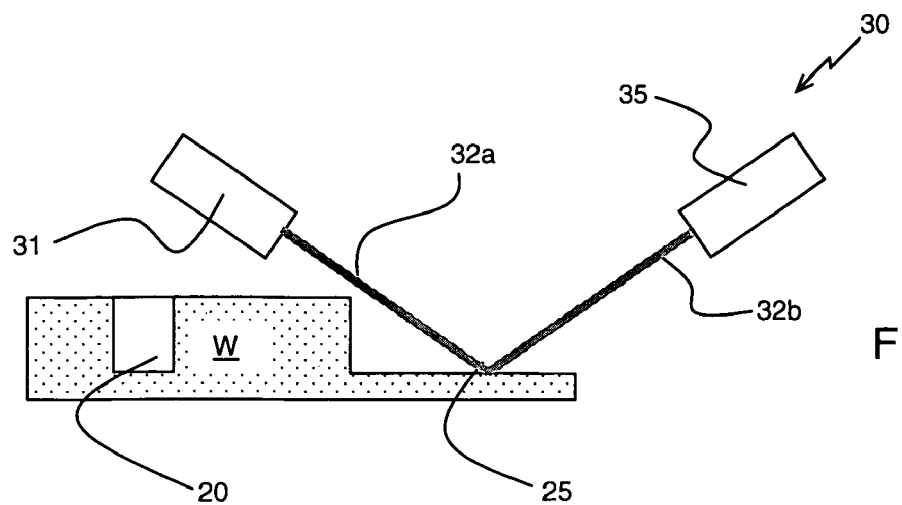
Figure 4E:
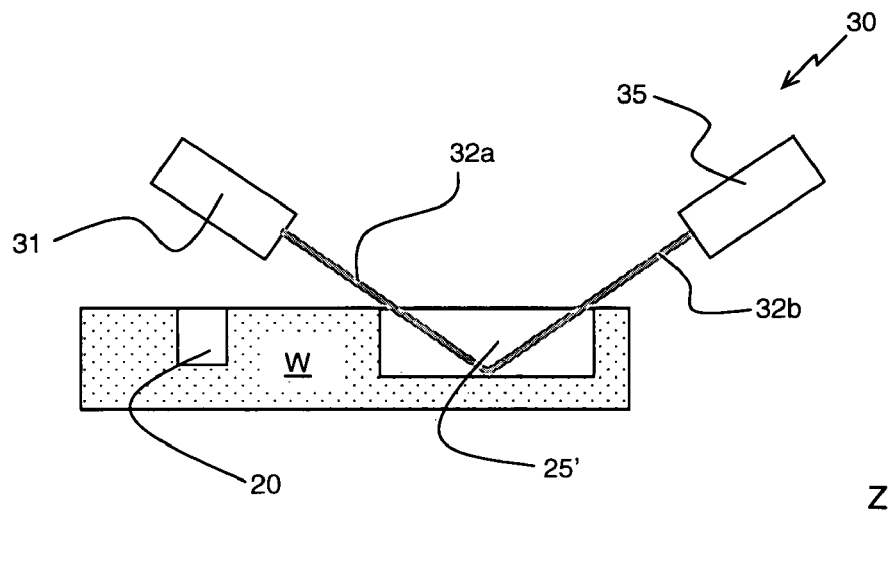

The reference feature 25 may be provided at an edge of the substrate, as shown in FIG. 4d. A reference feature provided at an edge of the substrate could be provided with a wall at one side only of its surface (i.e. the reference feature is a step at the edge of the substrate). The path of the level sensor beam 32 would then only be impeded by the wall in one direction. Thus, the length of the reference feature could be halved compared to what would otherwise be needed.

The reference feature 25 may, for example, be formed using the same fabrication process as the functional feature 20 and other functional features (not illustrated). For example, the functional feature 20 may be formed in the substrate W using an etching process that at the same time forms the reference feature 25. By forming the reference feature 25 using the same process (and at the same time) as the functional feature 20, any variations in the process used to form the features should have the same effect on the reference feature 25 as on the functional feature 20. It is believed that for a given substrate, the process (for example, etching) will have a generally consistent effect across that substrate. However, the effect of the process may be inconsistent when applied to successive substrates (e.g. the depth of a feature formed on a first substrate may be different to the depth of the same feature formed on a second substrate). Therefore, one or more reference features 25 may be provided on each substrate.

The depth of the reference feature 25 may be different from the depth of the functional feature 20. For example, due to differences in the speed of etching for different sized holes, the reference feature 25' may be deeper than the functional feature 20, as shown in FIG. 4e. Where this happens, calibration measurements may be made to determine the difference in depth. For example, a calibration measurement may comprise forming a plurality of functional features 20 and reference features 25 on a substrate, then cutting cross-sections of the substrate to allow the depth of the functional features and reference features to be measured. Where it is found that the depth of the functional features 20 is different from the depth of the reference feature 25, the difference between the depths is recorded and used during subsequent measurements. For example, the calibration may show that when the reference feature 25 is 120 microns deep, the functional feature 20 is 100 microns deep. This is recorded, so that when a reference feature is measured at being 120 microns deep during a subsequent measurement, the functional feature is known to be 100 microns deep.

Figure 5:
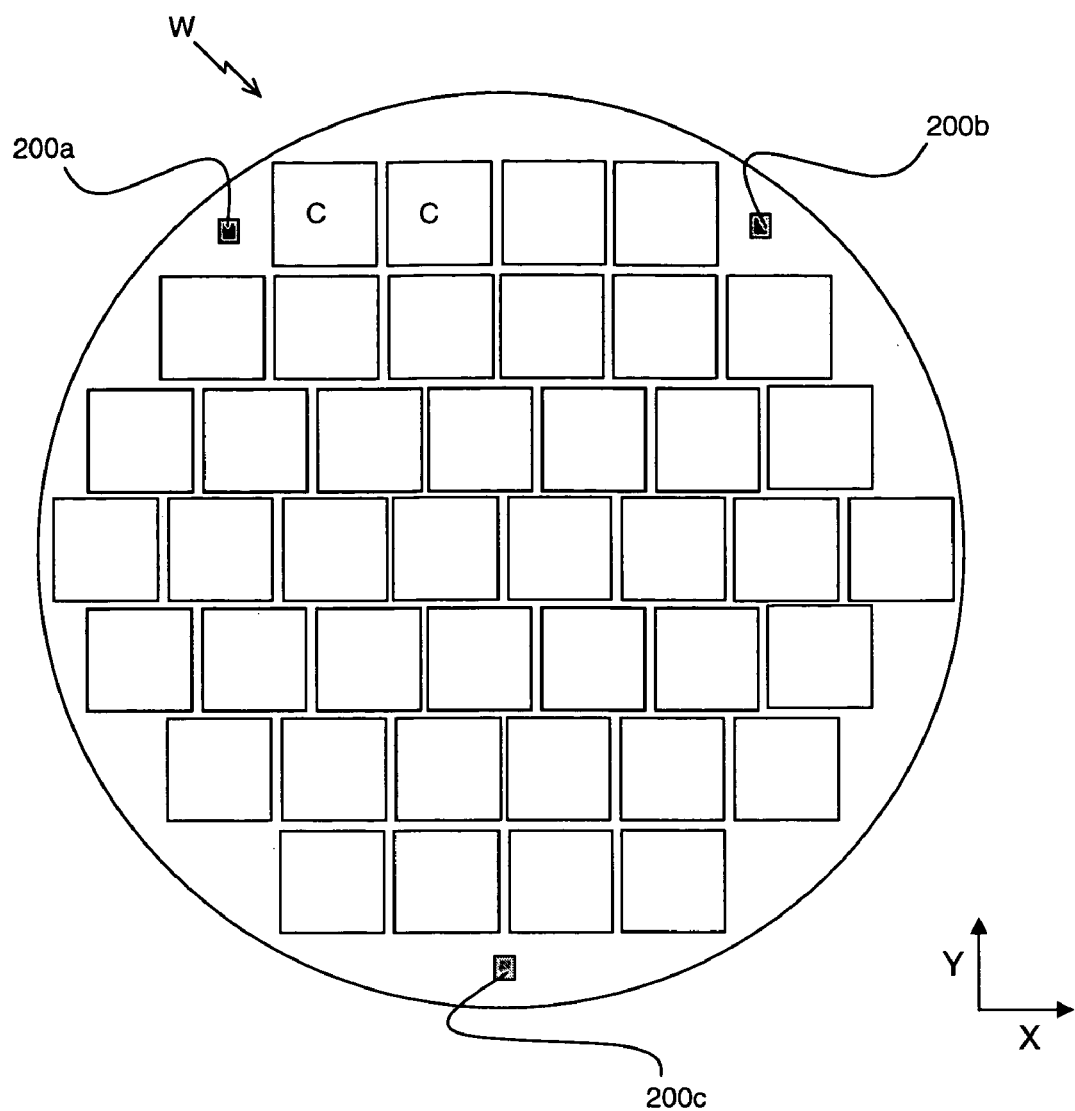
FIG. 5 illustrates a substrate for use in an embodiment of the invention.

With reference to FIG. 5, a substrate W may be provided with a number of separate target regions C. For example, each target region C may comprise a single device or die which is to be patterned (for example, a single integrated circuit or an individual MEMS device). The skilled person will appreciate that the target regions C may be of any desired size and shape (within the limitations of the lithographic apparatus) and may be arranged in any convenient pattern on the substrate W. The substrate W may, for example, comprise a circular silicon wafer with a diameter of 200 mm or 300 mm.

Referring to FIGS. 4 and 5 in combination, in an embodiment, each target region C may be provided with a reference feature 25 or 25' of the type described above. This may, for example, enable any local variations (i.e. variations from one target region to the next) in the fabrication of functional features 20 to be taken into account, when determining the heights of the surfaces within each target region C. Each target region may also include an unmodified portion (i.e. a portion whose height has not been changed), with respect to which the height of the reference feature 25 or 25' may be measured. The measurements of the reference features 25 or 25' in each target region may be used to form a map of the height profile of the substrate (for example if all the reference features are intended to have substantially the same height).

In an embodiment of the invention, a plurality of leveling points 200a-c are provided at spaced apart locations on the substrate W. In FIG. 5 three leveling points 200a-c have been provided. In an embodiment, more than three points may be provided. The leveling points 200a-c may, for example, be provided outside of the plurality of target regions C (as shown in FIG. 5) so as to utilize unused space on the substrate W. The leveling points 200a-c may, for example, be provided near to the periphery of the substrate W. The leveling points 200a-c may comprise unmodified portions of the substrate. Alternatively, the leveling points 200a-c may comprise reference features as described above and may, therefore, for example be etched surfaces.

In an embodiment of the invention, the height of the leveling points 200a-c is measured, and used to determine the overall tilt of the substrate W. For example, the leveling points 200a-c may be used to determine the tilt of the substrate with respect to the plane of the X and Y-axes and/or height of the substrate W. Thus "global" height and tilt information may also optionally be combined with the measurements of the reference features 25 or 25' in each target region C when forming a height map of the substrate W.

In the above description, references to an unmodified portion of the substrate are intended to refer to an area of the substrate in which recesses or raised portions have not been formed. For example, where etching is used, an unmodified portion is a portion of the substrate that has not been etched. The term 'unmodified portion' is not intended to mean that the portion of the substrate has not undergone any lithography.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target region", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to any device that can be used to impart a beam with a pattern in its cross-section such as to create a pattern in a target region of the substrate. It should be noted that the pattern imparted to the beam may not exactly correspond to the desired pattern in the target region of the substrate. Generally, the pattern imparted to the beam will correspond to a particular functional layer in a device being created in the target region, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device in a way depending on the orientation of the patterning device, the design of the lithographic apparatus, and other conditions, such as for example whether or not the patterning device is held in a vacuum environment. The support structure may use-mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables (and/or support structures) may be used in parallel, or preparatory steps may be carried out on one or more tables (and/or support structures) while one or more other tables (and/or support structures) are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

While specific embodiments of the invention have been described above, it will be appreciated that the invention may be practiced otherwise than as described. The description is not intended to limit the invention.

The invention claimed is:

1. A device manufacturing method comprising:
providing a substrate on a substrate table, the substrate having a target region comprising a plurality of generally planar surfaces, each surface having a different height relative to the substrate table and at least one of the surfaces has a height greater than or equal to about 3 µm higher than that of another of the generally planar surfaces;
determining the relative heights of each generally planar surface;
projecting a patterned beam of radiation onto the target region of the substrate such that the focal plane of the beam substantially coincides with the plane of one of the generally planar surfaces;
moving the substrate table in a direction substantially parallel to the axis of the beam; and
projecting the patterned beam of radiation onto the target region of the substrate such that the focal plane of the beam substantially coincides with the plane of another of the generally planar surfaces.

2. The method of claim 1, wherein the method further comprises repeating the following for other generally planar surfaces within the target region:
moving the substrate table in a direction substantially parallel to the axis of the beam; and
projecting the patterned beam of radiation onto the target region of the substrate such that the focal plane of the beam substantially coincides with the plane of each of the other generally planar surfaces.

3. The method of claim 1, wherein one of the generally planar surfaces forms the bottom of a recess or the top of a raised portion.

4. The method of claim 3, wherein one of the generally planar surfaces is an unmodified portion of the substrate.

5. The method of claim 4, wherein determining the height of a given generally planar surface comprises:
measuring the height of the unmodified portion of the substrate; and
measuring the height of the bottom of the recess or the top of the raised portion.

6. A device manufacturing method comprising:
providing a substrate on a substrate table, the substrate having a target region comprising a plurality of generally planar surfaces, each surface having a different height relative to the substrate table;
determining the relative heights of each generally planar surface:
projecting a patterned beam of radiation onto the target region of the substrate such that the focal plane of the beam substantially coincides with the plane of one of the generally planar surfaces;
moving the substrate table in a direction substantially parallel to the axis of the beam; and
projecting the patterned beam of radiation onto the target region of the substrate such that the focal plane of the beam substantially coincides with the plane of another of the generally planar surfaces,
wherein determining the height of a given generally planar surface comprises:

measuring the height of an unmodified portion of the substrate;

measuring the height of a reference feature of the substrate; and using the measured height of the reference feature to determine the height of the given generally planar surface.

7. The method of claim 6, wherein the reference feature has substantially the same height as the given generally planar surface.

8. The method of claim 6, wherein the reference feature has a height which is different to the height of the given generally planar surface and the method further comprises extrapolating the height of the given generally planar surface based on the measured height of the reference feature.

9. The method of claim 8, wherein the extrapolation is based upon one or more previously obtained calibration measurements.

10. The method of claim 6, wherein the reference feature is formed in the substrate in the same process as a functional feature having the given generally planar surface.

11. The method of claim 6, wherein the height of the given generally planar surface is measured using an optical level sensor.

12. The method of claim 11, wherein the optical sensor uses a narrowband source.

13. The method of claim 6, wherein the reference feature has a length which is sufficient, relative to the depth of the reference feature, to allow a sensor beam to reach a generally planar bottom surface of the reference feature, and be reflected from that surface to a sensor detector.

14. The method of claim 6, wherein the reference feature has a length of 2 mm or more.

15. The method of claim 6, wherein the substrate comprises a plurality of target regions, each target region having a reference feature.

16. The method of claim 15, further comprising using the positions and heights of the reference features to create a height map of the substrate.

17. The method of claim 6, wherein a plurality of leveling points are provided at spaced apart locations on the surface of the substrate and the method further comprises:

measuring a height of each leveling point relative to the substrate table;

measuring the location of each leveling point on a plane substantially parallel to the plane of the substrate table; and determining an average angle and height of the substrate with respect to the substrate table.

18. The method of claim 17, wherein the substrate further comprises a plurality of target regions, each target region having a reference feature and the method further comprises using a position and height of the reference features to create a height map of the substrate.

19. The method of claim 17, wherein each leveling point comprises a reference feature.

20. A lithographic apparatus, comprising:

a support structure configured to hold a patterning device, the patterning device configured to impart the beam with a pattern in its cross-section;

a substrate table configured to hold a substrate, the substrate having a target region comprising a plurality of generally planar surfaces, each surface being arranged at a different height relative to the substrate table and at least one of the surfaces has a height greater than or equal to about 3 µm higher than that of another of the generally planar surfaces;

a projection system configured to project a patterned beam onto a target region of the substrate; and a leveling system arranged to determine the relative heights of each generally planar surface and adjust the substrate table in a direction substantially parallel to the axis of the beam such that the focal plane of the beam substantially coincides with each plane during projection.

21. The apparatus of claim 20, wherein the leveling system comprises an optical level sensor.

* * * * *